United States Patent [19]

Kodama et al.

[11] Patent Number: 4,685,805
[45] Date of Patent: Aug. 11, 1987

[54] SMALL GAP MEASURING APPARATUS

[75] Inventors: Kenichi Kodama, Kawasaki; Akikazu Tanimoto, Yokohama; Hisao Izawa; Yoichi Hamashima, both of Kawasaki; Junji Hazama, Kawasaki, all of Japan

[73] Assignee: Nippon Kogaku K.K., Tokyo, Japan

[21] Appl. No.: 706,970

[22] Filed: Mar. 1, 1985

[30] Foreign Application Priority Data

Mar. 2, 1984 [JP] Japan .................................. 59-38837

[51] Int. Cl.$^4$ ............................................ G01B 11/00
[52] U.S. Cl. .................................... 356/373; 250/201
[58] Field of Search ............... 356/372, 373, 375, 400, 356/401; 250/561, 201, 201 DF, 201 PF, 201 AF

[56] References Cited

U.S. PATENT DOCUMENTS

| | | | |
|---|---|---|---|
| 3,990,798 | 11/1976 | White | 356/172 |
| 4,079,247 | 3/1978 | Bricot et al. | 250/201 DF |
| 4,315,201 | 2/1982 | Suzuki et al. | 356/400 |
| 4,636,626 | 1/1987 | Hazama et al. | 250/201 |

Primary Examiner—F. L. Evans
Attorney, Agent, or Firm—Michael N. Meller

[57] ABSTRACT

An apparatus for optically measuring the very small gap between a reference plane and a substrate parallel to the reference plane. A beam of energy converging on the reference plane is reflected by the substrate and a spot of reflected beam is formed on a detecting plane at a different position. An array of detecting elements for detecting the size of the spot on the detecting plane is adjusted in position in such a manner that the center of the spot coincides with the center of any one of the detecting elements, thereby preventing any error of the in-focus detecting position due to the deviation between the center of the spot and the center of the detecting element.

10 Claims, 26 Drawing Figures

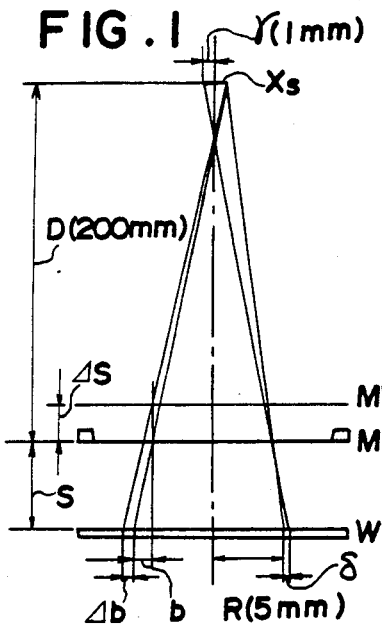
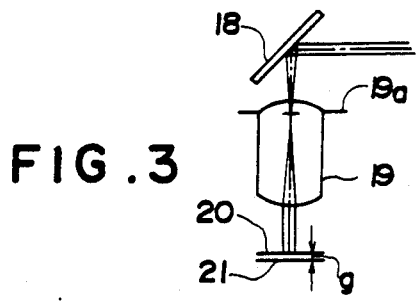
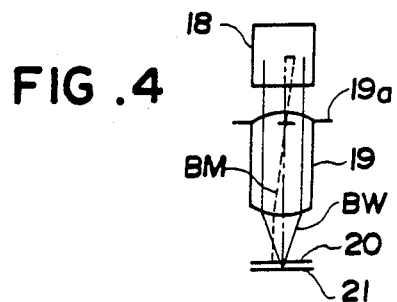
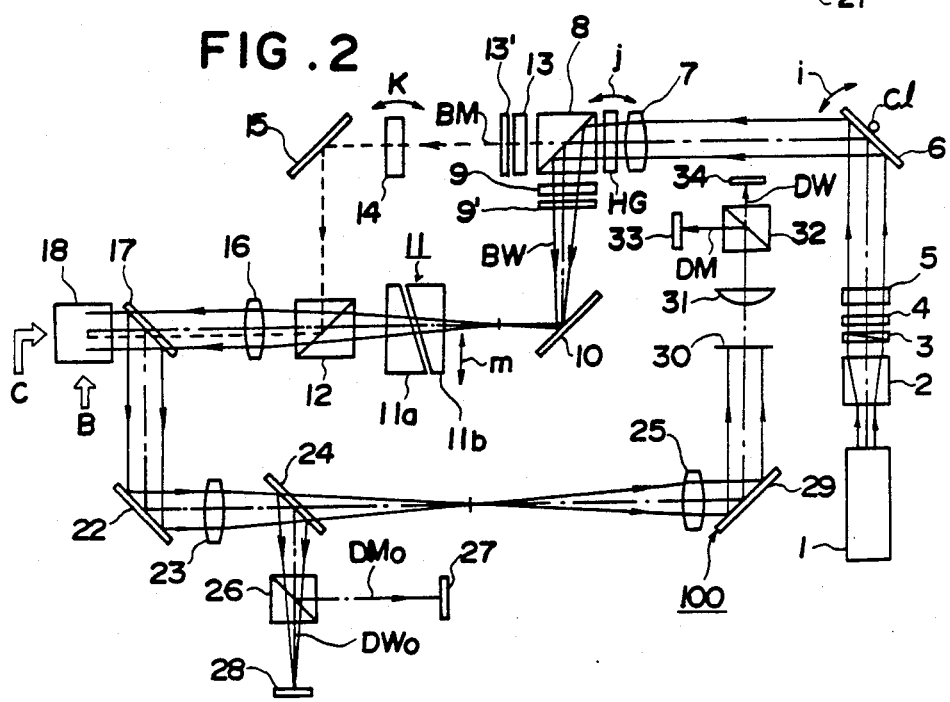

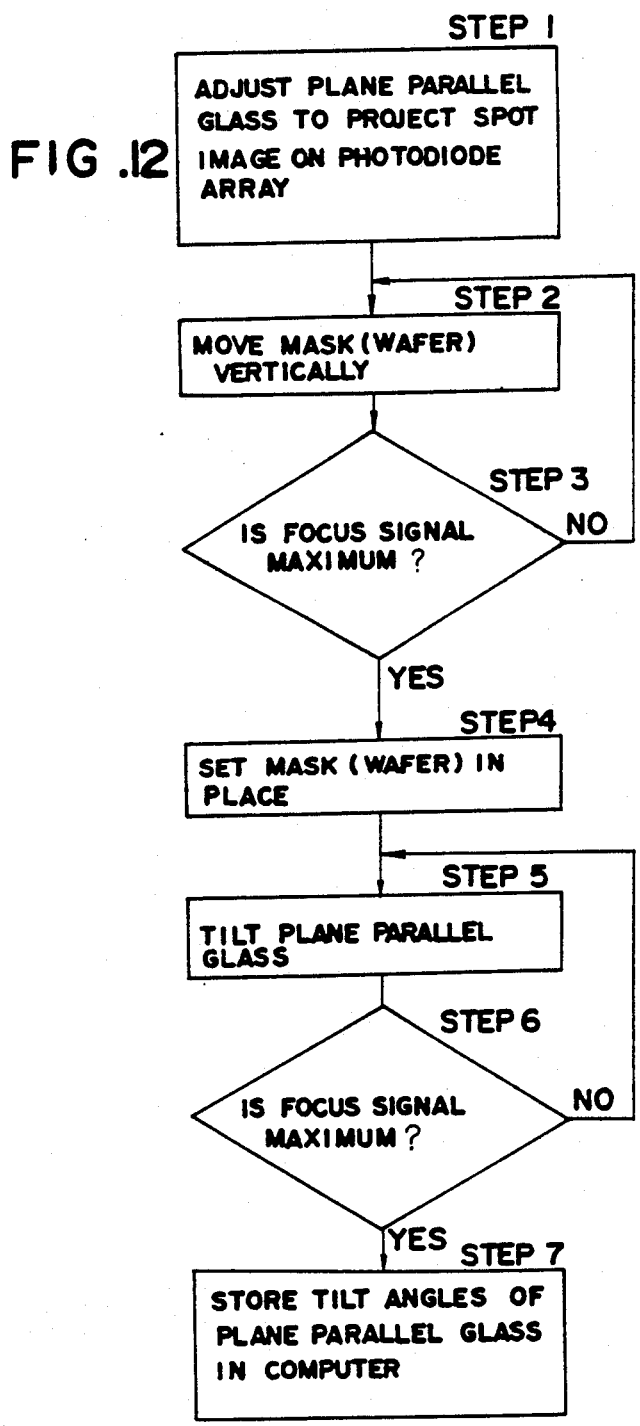

SMALL GAP MEASURING APPARATUS

BACKGROUND OF THE INVENTION

1. Field of the Invention

The present invention relates to a small gap measuring apparatus and more particularly to an apparatus well suited for optically measuring, with a high degree of accuracy, the gap between the opposing mask and wafer surfaces or the proximity gap in a proximity exposure system used in the manufacture of semiconductor integrated circuits.

2. Description of the Prior Art

In a proximity exposure system of the type in which a mask and a wafer are opposed with a small gap therebetween and the pattern on the mask is printed on the wafer, the gap between the mask and the wafer must accurately be preset to the desired value.

For this purpose, various apparatus have been proposed in the past in which the alignment is achieved by detecting the positions vertical to the surfaces of a mask and wafer. For example, a proximity exposure system is known which uses a gap detecting apparatus for detecting the position of a wafer surface relative to a mask surface by means of capacitance changes.

However, more accurate alignment has been required every year for these exposure systems and it has been impossible to obtain satisfactory accuracy with the conventional methods.

SUMMARY OF THE INVENTION

It is the primary object of the present invention to provide a small gap measuring apparatus which is well suited for overcoming the foregoing deficiencies in the prior art and makes possible the measurement of small gaps with greater accuracy.

Thus, in accordance with the invention there is provided an apparatus so designed that a beam of energy (e.g., a laser beam) focussed (converged) on a reference plane at a predetermined position is projected on a reflective portion of a substrate such as a mask or wafer arranged substantially parallel to the reference plane so that the reflected beam from the substrate is focussed (converged) on a detecting plane arranged at a different position and the gap between the reference plane and the substrate is detected in accordance with the size of the spot of the refleted beam on the detecting plane. More particularly, the apparatus of the present invention comprises a plurality of detecting elements arranged on the detecting plane for detecting the spot of the reflected beam and adjusting means for adjusting the relative positions of the reflected beam and the plurality of detecting elements in such a manner that the center of the reflected beam spot substantially coincides with the center of any one of the detecting elements, thereby making it possible to effect the detection in a condition where the center position of the spot always coincides substantially with the center of any one of the detecting elements and thereby preventing the occurrence of any deviation of the in-focus detecting position due to the deviation between the spot and the detecting element center and achieving a high-sensitivity and high-accuracy gap detection.

BRIEF DESCRIPTION OF THE DRAWINGS

FIG. 1 is an optical path diagram showing the geometric relations of an optical system in an X-ray proximity exposure system.

FIG. 2 is an optical path diagram showing the construction of an optical system in an alignment apparatus incorporating an embodiment of the invention.

FIGS. 3 and 4 are partial optical path diagrams of FIG. 2 which are viewed along the direction of arrows B and C, respectively.

FIG. 12 is a flowchart for the focus detecting operation.

DESCRIPTION OF THE PREFERRED EMBODIMENTS

Figure 5:
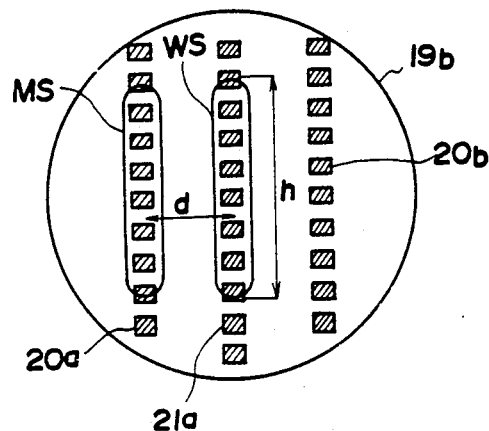
FIG. 5 is a diagram showing the positional relation between beam spots and marks within the field of an objective lens.

Prior to proceeding to describe the present invention by way of its preferred embodiments, the disadvantages of the previously described prior art will be described in a simple manner with reference to FIG. 1.

With an X-ray proximity exposure system, for example, it is the general practice to use an X-ray source of the type which excites a fixed target with an electron beam and in this case the proximity gap between a mask and a wafer and its required accuracy are primarily determined by the geometrical relations such as shown in FIG. 1. In the Figure, an X-ray source $X_s$ has an apparent magnitude of a half width r and a beam of X-rays is projected on a mask M and a wafer W with a spread. The resolution of the X-ray exposure is mainly determined by a penumbral blur $\delta$ due to the spread of the X-ray source and a geometric distortion error $\Delta b$ due to a setting error $\Delta s$ of the proximity gap S between the mask and the wafer. In FIG. 1, if D represents the distance between the X-ray source $X_s$ and the mask, R the half-width value of the image of the X-ray source $X_s$ on the wafer surface and b the difference (distortion) between the half-width values of the X-ray source images on the mask surface and the wafer surface due to the spread of the X-ray projection, then the values of $\delta$ and $\Delta b$ are given as follows.

$$\delta = S \cdot (2r/D)$$

$$\Delta b \approx \Delta s \cdot (R+r)/D$$

In this case, R=5 mm, r=1 mm and D=200 mm, to satisfy $\delta<0.2$ $\mu$m and $\Delta b<0.05$ $\mu$m, it is necessary to adjust the mask and wafer gap so as to obtain S<20 $\mu$m, and $\Delta s<2$ $\mu$m thus requiring a detecting system having such a high degree of gap detecting accuracy as amounting to about one several of the tolerance of $\Delta s$.

The below-mentioned embodiment of the invention shows a case in which a small gap measuring apparatus according to the invention is incorporated in a detecting system of a mask-wafer alignment apparatus of a proximity exposure system used in the fabrication of semiconductor integrated circuits by way of example.

FIGS. 2 to 4 are optical path diagrams showing the detecting optical system of the alignment apparatus incorporating the embodiment of the invention.

The laser beam projected from a laser source 1 is converted to a collimated light beam through a beam expander 2, a polarizing plate 3 and a quarter-wave plate 4 and projected on a cylindrical lens 5. In this case, the laser beam is converted to a circularly polarized light through the polarizing plate 3 and the quarter-wave plate 4. The laser beam is converted to a long and narrow beam having an elongated section through the cylindrical lens 5 and it reaches a vibrating mirror 6. The focal position of the cylindrical lens 5 is coincident with the center of the vibrating mirror 6. In FIG. 2, the laser beam projected from the cylindrical lens 5 is converted to an elongated beam spot converged into the paper plane on the reflecting surface of the vibrating mirror 6. In other words, the cylindrical lens 5 has no power within the paper plane of FIG. 2 and it possesses a power in the direction perpendicular to the plane of the paper. The light beam reflected from the vibrating mirror 6 is spread in the direction perpendicular to the paper plane, is passed through a lens 7 whose focal point is coincident with the center of the vibrating mirror 6 and reaches a polarizing beam splitter 8 through a plane parallel glass HG which shifts the beam in either direction of an arrow j within the paper plane. It is to be noted that the vibrating mirror 6 has a rotary shaft Ce which makes a vibratory rotation vertical to the paper plane of FIG. 2 and it oscillates the beam which reaches the lens 7 in the directions of an arrow i.

Then, the elongated beam incident to the beam splitter 8 is divided into two components P and S and thus the focal positions of a mask and wafer are detected by the common optical system. One of the split beams is used as a wafer illuminating beam BW so that its plane of polarization is rotated by 90° through a half-wave plate 9, is reflected by a mirror 10 and reaches a beam combining polarizing beam splitter 12 through an optical length correcting prism 11. The other of the divided beams from the beam splitter 8 is used as a mask illuminating beam BM so that its plane of polarization is rotated by 90° through a half-wave plate 13, is passed through a plane parallel glass 14 which is tiltable in either direction of an arrow k to shift the beam, is reflected by a mirror 15 and then reaches the beam splitter 12. It is to be noted that in this embodiment the beam splitters 8 and 12 are each composed of a polarizing half mirror which divides a light beam by polarization for the purpose of improving the S/N ratio of photoelectric signals and for the purpose of this division polarizing plate 9' and 13' are respectively provided in the rear of the half-wave plates 9 and 13. Then, the light beams BW and BM incident to the beam splitter 12 are again combined into a single light beam and the combined beam reaches a mirror 18 through a lens 16 and a half mirror 17. The mirror 18 is tilted at an angle of 45° to reflect the beam from the half mirror 17 to the back side of the paper plane. On the other hand, the mirror 15 is arranged in such a manner that the beam center of the beam BM combined by the beam splitter 12 is eccentric with respect to the beam center of the beam BW in correspondence to the predetermined deviation between the alignment marks on the wafer and the alignment marks on the mask which will be described later.

FIGS. 3 and 4 show the mirror 18 as viewed in the direction of arrows B and C, respectively, in FIG. 2.

The combined beams BM and BW are respectively converged through an objective lens 19 on a reference plane coincident with the pattern surface of a mask 20 and a reference plane coincident with the surface of a wafer 21 and an elongated beam spot is imaged on each of the reference planes. If g represents the gap (a so-called proximity gap) between the mask 20 and the wafer 21, the numerical number of the objective lens 19 is selected so large that its depth of focus becomes small enough as compared with the gap g. Also, the gap g is a characteristic value optimally determined for each exposure system. Then, in order to image the beams BM and BW as elongated spots at positions apart by the gap g in the direction of the optical axis of the objective lens 19, two trapezoidal prisms 11a and 11b forming the optical length correcting prism 11 are relatively moved in the vertical direction with respect to the optical axis (in either the direction of arrow m in FIG. 2 or the direction vertical to the paper plane). It is to be noted that the beam passing through the prisms 11a and 11b is converted through the action of the cylindrical lens 5 to a converged beam within the paper plane and to a collimated beam in the direction vertical to the paper plane.

On the other hand, the lenses 7 and 16 form an afocal system and they are arranged so that the focal position of the lens 7 coincides with the center of the vibrating mirror 6 and the focal position of the lens 16 coincides with a pupil 19a of the objective lens 19. As a result, irrespective of the presence or absence of the optical length correcting prism 11, the vibrating mirror 6 and the pupil 19a of the objective lens 19 become conjugate optically, thereby forming a telecentric illuminating optical system.

The relation between the beam spots imaged by the objective lens 19 and the marks on the mask 20 and the wafer 21 will now be described with reference to FIG. 5. The Figure shows the beam spots and the arrangement of the masks within a field 19b of the objective lens 19.

Then, the beam BW is incident to the objective lens 19 such that its center coincides with the optical axis of the objective lens 19. An elongated spot WS resulting from the beam BW is imaged through the transparent portion of the mask 20 at marks 21a formed in a grating pattern of 5 μm width and about 100 μm length on the wafer 21. On the other hand, an elongated spot MS resulting from the beam BM is imaged at marks 20a formed in a diffraction grating pattern of 5 μm width and about 100 μm length on the mask 20 at a position which is eccentric with the optical axis of the objective lens 19 horizontally by a distance d. It is also arranged so that the beam spots WS and MS are parallel to each other within the field 19a and their longitudinal directions coincide with the directions of the lattice arrangement of the marks 20a and 21a. Also, the widths of the beam spots WS and MS are selected to be substantially equal to the width of the marks 20a and 21a. Then, the vibrating mirror 6 is caused to make reciprocating rotary vibrations, thereby causing the spots WS and MS to simultaneously oscillate at a fixed frequency and amplitude perpendicularly to their longitudinal directions. The individual lattice elements (the marks 20a and 21a) of the diffraction grating patterns produce scattered light at their edges so that if a plurality of these lattice elements are arranged at a given pitch determined in accordance with the wavelength of the illuminating light beam (laser beam), a diffracted beam is generated in a specified direction from a group including a plurality of the elements as a result of interference among the scattered light from the elements. Thus, in accordance with this embodiment, the diffracted beams DM and DW from the marks 20a and 21a, respectively, are projected back to the objective lens 19 at such angles tending to spread in the longitudinal directions of the beam spots MS and WS. It is to be noted that by increasing the length h of the spots MS and WS with respect to their widths, it is possible to further improve the detection accuracy of the marks 20a and 21a. In addition, the mark 20 is formed with marks 20b which are similar and arranged in parallel to the marks 20a. The distance between the marks 20a and 20b is selected to have a dimension so as to not shut the optical path of the beam BW determined by the numerical aperture of the objective lens 19 and the gap g. Also, the marks 20b do not in fact make any contribution to the photoelectric mark detection. However, if the marks 20b are provided such that the distance between the marks 20a and 20b becomes 2d, it is extremely convenient for making the alignment by visual insertion.

When the alignment marks on the mask 20 and the wafer 21 are respectively illuminated by the elongated spots imaged at the mask 20 and the wafer 21 by the beam projecting means constructed as above described, diffracted beams including the zero-order light are produced as light information from the marks. If the flat surface portions of the mask 20 and the wafer 21 including no marks are illuminated, reflected beams are produced if these portions are reflective. This light information is projected back to the objective lens 19, is reflected by the mirror 18, the half mirror 17 and a mirror 22 and then reaches a lens 23. Note that the focal position of the lens 23 is selected so as to coincide with the pupil 19a of the objective lens 19. A part of the light information passed through the lens 23 is reflected by a half mirror 24 and projected on a polarizing beam splitter 26 which is similar to the beam splitters 8 and 12. The polarizing beam splitter 26 separates the zero-order beam $DM_o$ from the mask 20 and the zero-order beam $DW_o$ from the wafer 21 in accordance with the polarized light components P and S and they are respectively directed to the photosensitive surfaces (detecting planes) of photodiode arrays 27 and 28 which each comprise a plurality of photodiodes. The photodiode arrays 27 and 28 are photoelectric conversion detectors for detecting the size of the beam spots on the mask 20 and the wafer 21 and they may, for example, be comprised of CCD one-dimensional image sensors.

Assuming now that $f_1$ and $f_2(f_1 < f_2)$ represent the focal lengths of the objective lens 19 and the lens 23, respectively, the elongated spot on the wafer or mask surface results in a real image enlarged by a lateral magnification $f_2/f_1$ and longitudinal magnification $(f_2/f_1)^2$ on the photosensitive surface of the photodiode array 27 or 28.

In the condition where the reflected beam of the elongated spot on the mask is projected on the photosensitive surface of the photodiode array 27, if the mask stage is moved relative to the objective lens 19 in the optical axis direction thereof, the enlarged spot image formed on the photosensitive surface of the photodiode array 27 changes its shape and the magnitude of an output signal from the photodiode array 27 is also changed correspondingly. By preliminarily adjusting the detecting system so that the output peak value of the photodiode array 27 becomes maximum when the beam BM is focussed on the mask 20, it is possible to detect the in-focus position of the mask 20 with respect to the focal position of the objective lens 19 by moving the mask stage in the optical axis direction of the objective lens 19 in such a manner that the output peak value of the photodiode array 27 becomes maximum.

This is all the same with the wafer 21 and therefore its in-focus position corresponds to the wafer stage position at which the output peak value of the photodiode array 28 becomes maximum.

In this case, due to the fact that the photodiode array including a plurality of photodiodes is used as the photosensitive device for photoelectric conversion detection purposes in place of a single pin-photodiode, no trouble will be caused in the detection of an in-focus position even if the elongated spot is laterally moved one-dimensionally over the mask or wafer.

Also, while the variation characteristic of the peak value of an array output (hereinafter referred to as a focus signal) in response to the previously mentioned movement of the mask or wafer in the optical axis direction differs depending on whether the center of the enlarged image of the elongated spot is coincident with the center of any one of the photodiodes of the array on the photosensitive surface of the photodiode array 27 or 28, in accordance with the invention the tilt of the plane parallel glass HG (FIG. 2) is adjusted in either direction of the arrow j so that during the infocus position detection the center of the enlarged elongated spot image coincides with the center of any one of the photodiodes in the array and the maximum peak value is obtained, thereby always achieving the desired high-accuracy focus detection with the best S/N ratio and sensitivity. Thus, in accordance with the alignment apparatus shown by the embodiment the proximity gap or the positional deviation of the mask 20 (or the wafer 21) from the focal position (the reference plane) of the objective lens 19 is detected with a high degree of accuracy and the mask 20 (or the wafer 21) is moved relatively in the optical axis direction (hereinafter referred to as a Z direction) of the objective lens 19, thereby accurately focusing the beam spot on the mask 20 (or the wafer 21). Further, the apparatus can be utilized for the automatic setting of the gap g.

Figure 6:
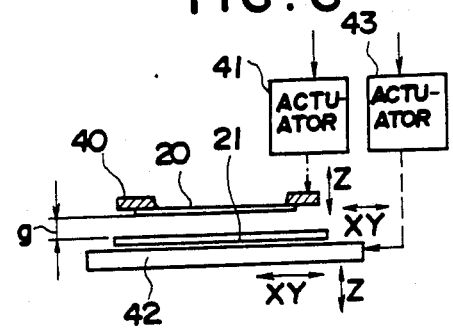
FIG. 6 is a schematic diagram showing the construction of an actuating unit for enabling relative movement of a mask and a wafer.

FIG. 6 shows an actuating unit for moving the mask 20 and the wafer 21 relative to each other. The surface on which side the objective lens 19 is positioned or the upper surface of the mask 20 is held on a mask holder 40. The mask holder 40 is movable by an actuator 4 in the direction of the gap between it and the wafer 21 (i.e., the Z direction) and in the X and Y directions. Also, the actuator 41 includes an encoder or the like for detecting its position in the Z direction. On the other hand, the wafer 21 is mounted on a stage 42 which is two-dimensionally movable relative to the mask 20 and the stage 42 is moved by an actuator 43. The actuator 43 also moves the wafer 21 vertically in the Z direction and it similarly incorporates an encoder or the like for detecting its Z-direction position.

Figure 7:
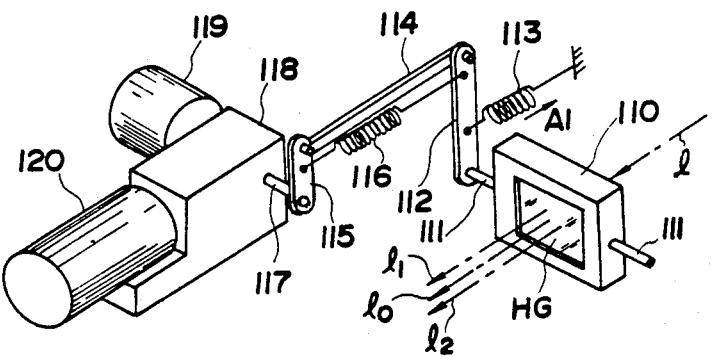
FIG. 7 is a perspective diagram showing an example of a plane parallel glass tilting mechanism forming adjusting means.

FIG. 7 shows the principal parts of the means for adjusting the tilt of the plane parallel glass HG in either direction of the arrow j in FIG. 2 such that the center of the enlarged elongated spot image projected on the photodiode array 27 or 28 coincides with the center of any one of the photodiodes. The plane parallel glass HG is supported in a flame member 110 secured to one end of a lever 112 through a rotary shaft 111. Note that the rotary shaft 111 is positioned perpendicular to the paper plane in FIG. 2. One end of a link 114 is connected in sliding contact to the other end of the lever 112 and the other end of the link 114 is connected in sliding contact to the forward end of a lever 115 secured to a driving shaft 117. The lever 112 is pulled in the direction of an arrow $A_l$ by a spring 113 connected to its central portion and also the levers 112 and 115 are biased by a spring 116 so that they pull each other at all times. The driving shaft 117 is connected to the shaft of a rotary encoder 119 through a gear train provided in a gear box 118 and the gear train transmits the rotation of a motor 120 at a reduced speed to the driving shaft 117. By using this driving unit, the plane parallel glass HG is tilted about the rotary shaft 111 for making a centering adjustment during the focus detection and an adjustment for the succeeding mask and wafer alignment.

Figure 8A:
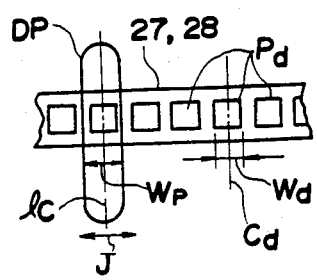
FIGS. 8A and 8B are enlarged views showing the positional and dimensional relations between the arrangement of devices of a photodiode array serving as detecting elements and an elongated beam spot.

FIG. 8A shows the positional relation between the enlarged elongated spot image DP on the photosensitive surface of the photodiode array 27 or 28 and the individual photodiodes. The plane parallel glass HG is tilted in either of the directions (the arrow J) perpendicular to the longitudinal direction of the enlarged elongated spot image HG and the spot image DP is shifted in the arranging direction of the array. The width dimension $W_p$ of the enlarged elongated spot image DP on the photosensitive surface of the photodiode array 27 or 28 can be varied by suitably selecting the magnification which is determined by the focal lengths $f_1$ and $f_2$ of the objective lens 19 and the lens 23 as mentioned previously. In the illustrated embodiment, the width $W_p$ is somewhat large as compared with the width $W_d$ of the photodiodes and the magnification is selected in such a manner that when the longitudinal central axis $l_c$ of the enlarged elongated spot image DP is coincident with the center $C_d$ of any one of the photodiodes Pd, the side edges of the enlarged image do not extend over the adjacent photodiodes.

Figure 8B:
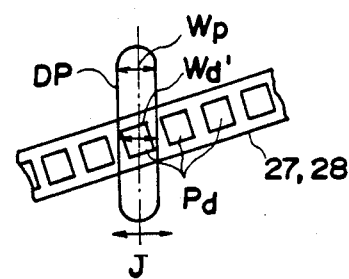

In this case, what is meant by the center of the photodiodes Pd is the geometrical center of the photodiodes Pd with respect to the shifting direction J of the enlarged elongated spot image and it may be considered to be the middle point of the diagonal line if the photosensitive surfaces of the photodiodes Pd have a rectangular shape. By directing the arranging direction of the photodiodes Pd to skew with respect to the shifting direction J as shown in FIG. 8B, it is possible to make the width $W_p$ of the enlarged spot image DP substantially equal to the photosensitive width $W'_d$ of the photodiodes along the shifting direction. However, they need not necessarily be made equal to each other and it is only necessary to satisfy the relation $W_p > W'_d$.

Generally, if a laser beam is converged into a spot, the light intensity distribution perpendicular to its optical axis takes a form of Gaussian distribution so that when the axial center $l_c$ of the spot coincides with the center $C_d$ of the photodiode Pd, the photoelectric output of the photodiode Pd increases to the maximum. Thus, the construction of FIG. 8B has the effect of improving the S/N ratio and therefore it is more preferable.

Where the alignment apparatus is not required to shift the beams BM and BW for aligning purposes, it is possible to arrange so that instead of positioning the plane parallel glass HG in the rear of the lens 7, it is positioned in the optical path between the lens 23 and the prism 26 and only the reflected beams DM and DW are shifted for centering purposes.

Also, the elongated spot for the previously mentioned focus detecting purposes may be replaced with a circular spot and in this case the shifting direction of the enlarged circular spot image on the photosensitive surface of each of the photodiode arrays 27 and 28 is along the direction of arrangement of the photodiodes.

The embodiment shown in FIG. 2 includes a separate detecting system which achieves the desired mask and wafer alignment by utilizing the diffracted beams of the beams DM and DW passed from the lens 23 through the half mirror 24 and the alignment mode of operation of this detecting system will now be described.

As part of the light information passed from the lens 23 through the half mirror 24 reaches a lens 25. The lenses 23 and 25 form an afocal system and the half mirror 24 is arranged in its parallel optical path. Note that the back incident beam reaching the lens 23 is substantially parallel within the paper plane of FIG. 2 and it becomes a converged beam in a direction vertical to the paper plane. Thus, in the direction perpendicular to the paper plane in the optical path of the lenses 23 and 25, the beam takes the form of a collimated light beam.

Then, the light information passed through the half mirror 24 is projected to the lens 25 so as to be used for the purpose of mask and wafer alignment. The light information passed through the lens 25 is reflected by a mirror 29 and reaches a spatial filter 30 which cuts off the zero-order beams $DM_o$ and $DW_o$ and passes the diffracted beams of the other orders. The diffracted beams having the orders greater than the first order and passed through the spatial filter 30 are condensed by a condensing lens 31 and projected to a polarizing half prism 32. The polarizing half prism 32 divides by polarization the incident diffracted beam into the diffracted beam DM from the mask 20 and the diffracted beam DW from the wafer 21 and directs them to photoelectric detectors 33 and 34, respectively.

Figure 9:
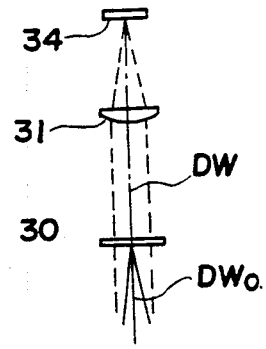
FIG. 9 is a partial optical path diagram of an alignment focus detecting system utilizing a diffracted beam detection method.

FIG. 9 shows the relation between the arrangement of the spatial filter 30, the condensing lens 31 and the photoelectric detector 34 and the zero-order beam $DW_o$ and the diffracted beam DW. In the Figure, the spatial filter 30 is arranged at the focal position of the lens 25. As a result, the pupil 19a of the objective lens 19 and the spatial filter 30 are conjugate to each other and the pupil image of the objective lens 19 is formed on the spatial filter 30. It is to be noted that the spatial filter 30 may be a transparent plate having an elongated zero-order beam cut-off shielding portion conforming with the shape of the spots.

Figure 10:
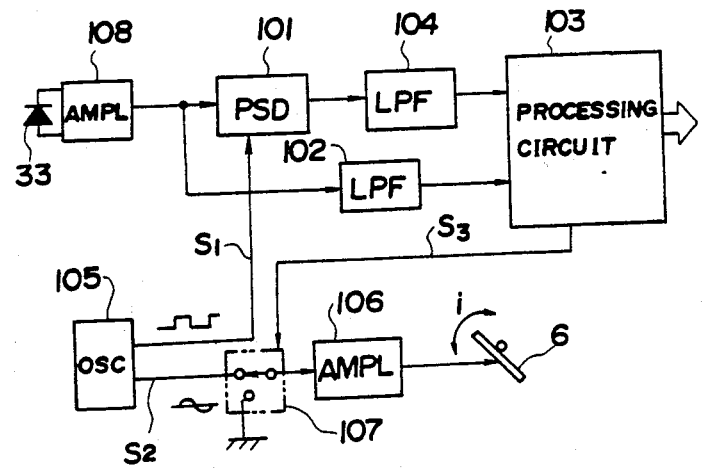
FIG. 10 is a block diagram showing an exemplary construction of the mark detecting circuit for the detecting system of FIG. 9.

FIG. 10 shows a mark detecting circuit for detecting the marks 20a on the mask 20. Note that a circuit used for detecting the marks 21a on the wafer 21 is similar in construction and will not be described. In FIG. 10, the output signal of the photoelectric detector 33 for receiving the diffracted beam from the marks 20a is amplified by a preamplifier 108 and it is applied as a voltage signal corresponding to the light quantity of the diffracted beam DM to a phase synchronous detector (PSD) 101 and a low-pass filter (LPF) 102 for cutting off the high-frequency noise from the output signal of the preamplifier 108. The output of the PSD 101 is applied to a low-pass filter or LPF 104 and the signal is generated from the LPF 104 as a dc signal corresponding to the deviation in position between the marks 20a and the spot MS. On the other hand, an oscillator or OSC 105 generates a rectangular signal $S_1$ and a sinusoidal signal $S_2$ at the same frequency so that the rectangular signal is applied as a reference signal to the PSD 101, where the signal is used for detecting the phase difference between the output signal of the preamplifier 108 and the rectangular signal $S_1$ and the sinusoidal signal $S_2$ is amplified by a power amplifier 106 so as to drive the vibrating mirror 6 shown in FIG. 2. Generally, the PSD 101 may be comprised of a multiplifer or the like and its output signal includes a ripple (a high-frequency component) making it necessary to pass the signal through the LPF 104 to produce a dc signal as mentioned previously.

The PSD 101 and the LPF 104 detect the relative positional deviation between the width-direction center of the marks 20a on the mask 20 and the oscillation center of the spot MS, that is, the deviation of the mask 20 within the plane, and use it for achieving the alignment between the mask 20 and the wafer 21.

Then, the output signal of the LPF 104 results in an S-curve signal corresponding to the deviation so that the center of the marks 20a coincides with the oscillation center of the spot MS when the S-curve signal attains the zero point.

The output signals from the LPF 102 and 104 are applied to a signal processing circuit 103. The signal processing circuit 103 includes, for example, an A/D converter for subjecting the output signal of the LPF 102 to analog-to-digital conversion. Thus, the digital value from the A/D converter corresponds to the light quantity of the diffracted beam DM. On the other hand, the signal $S_2$ is applied to the power amplifier 106 through a switch 107. The switch 107 is responsive to a selection signal $S_3$ from the signal processing circuit 103 so that in the alignment mode the sinusoidal signal $S_2$ from the OSC 105 is applied to the power amplifier 106, thus vibrating the vibrating mirror 6 as in the position shown in FIG. 10 and in the focussing mode the signal $S_2$ is blocked, thus bringing the vibrating mirror 6 to a stop at the neutral position (the middle point of vibration).

The digital output and the S-curve signal from the signal processing circuit 103 are processed by a computer, which will be described later, for controlling the relative positions (the positions in the X and Y directions) of the mask 20 and the wafer 21 by means of the actuators 41 and 43 of FIG. 6.

Figure 11:
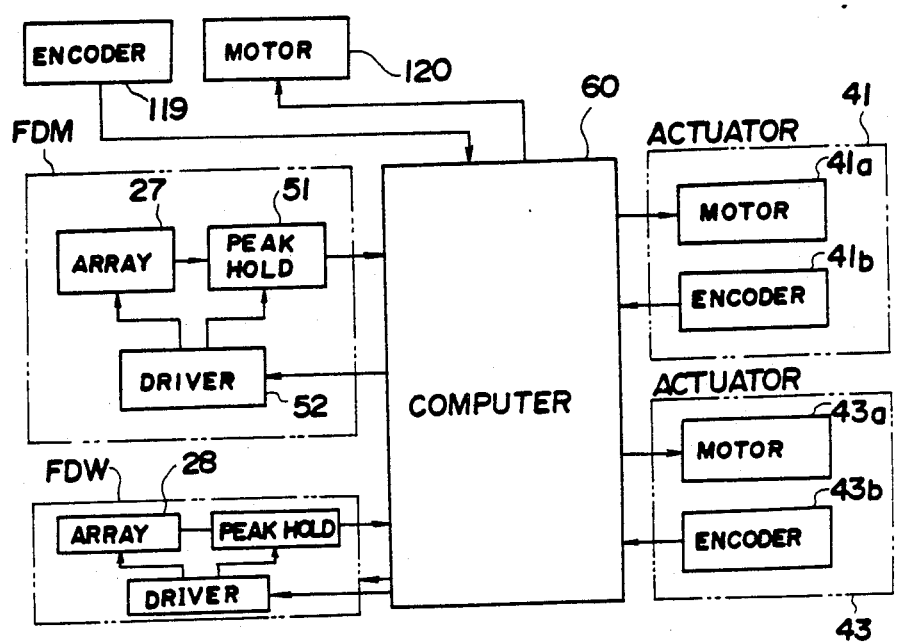
FIG. 11 is a block diagram showing the construction of the signal processing circuit for the focus detecting system.

FIG. 11 shows the signal processing circuit used in the focus detecting system of the present embodiment. Designated at FDW is a processing unit for masks and FDM a processing unit for wafers. These units are connected, along with the rotary encoder 119 and the motor 120 shown in FIG. 7, to a computer 60 and also connected to the computer 60 are the mask actuator 41 and the wafer actuator 43 shown in FIG. 6. The actuator 41 includes a motor 41a for vertically moving the mask holder 40 (FIG. 6) in the Z direction and a linear encoder 41b for detecting the position of the holder 40 in the Z direction, and similarly the actuator 43 includes a motor 43a for moving the wafer stage 42 in the Z direction and a linear encoder 43b for detecting the position of the wafer stage 42 in the Z direction.

In the mask processing unit FDM, the output signal of each of the photodiodes in the photodiode array 27 is applied to a peak hold circuit 51. The photodiode array 27 and the peak hold circuit 51 are operated by a driver circuit 52 under the control of the computer 60 and in this way the reading of charge for each photodiode of the photodiode array 27 is effected.

When the photoelectric output signals of the photodiodes in the photodiode array 27 are read in a time sequential manner, the peak hold circuit 51 holds the value of the maximum one of the photoelectric output signals. After the reading of the array as a whole has been completed, this hold state is maintained so that when the photodiode array 27 is to be read again, the holding content of the peak hold circuit 51 is first set to zero by the driver circuit 51 and then the peak holding operation is performed.

The above-mentioned peak holding operation is also performed in the like manner for the photodiode array 28 in the wafer processing unit FDW.

The magnitude of the photoelectric output signal peak value thus obtained by peak holding is read as a digital value into the computer 60 and the desired analysis or an analysis of the imaging condition of the enlarged spot image DP on the photosensitive surface of the photodiode 27 or 28 is performed.

The computer 60 serves the function of reading the output of the rotary encoder 119 adapted to detect the tilt angle of the plane parallel glass HG and applying a drive command to the motor 120 for the glass HG.

The computer 60 also applies a drive command to the motor 41a of the mask actuator 41 and to the motor 43a of the wafer actuates 43 and reads the results of measurements of the linear encoders 41a and 43a.

Then, a description will now be given of the focus detecting operation according to the invention which is performed under the control of the computer 60.

The vibrating mirror 6 is first brought to a stop at the neutral position. For this purpose, it is only necessary to change the position of the switch 107 in FIG. 10 such that the vibrating mirror 6 is stopped at the neutral position of its rotational vibration when the operating mode is set to the focus detecting mode. It is to be noted that the vibrating mirror 6 is vibrated to ensure that the desired accurate alignment by diffracted beams is made in the alignment operation mode which will be decribed later.

FIG. 12 is a flow chart showing the principal steps of the focus detecting operation. At the first step 1, the motor 120 is operated to adjust the tilt angle of the plane parallel glass HG in such a manner that the enlarged spot image DP is projected onto the mask photodiode array 27. At the next step 2, the motor 41a of the mask actuator 41 is operated and the mask holder 40 is stepped a predetermined amount in the forward or reverse direction. At a step 3, the reading of the photoelectric output signals from the photodiode array 27 and the detection of a peak value (the detection of a focus signal) are effected to determine whether the peak value is maximum. When the peak value attains the maximum value as a result of the repetition of the steps 2 and 3, a transfer is made to a step 4 where the motor 41a is stopped and the mask holder 40 is set in its Z-direction position.

FIGS. 13 and 14 respectively show, in corresponding relation, the changes in the shape of the enlarged spot image DP on the photodiode array 27 and the variations in the distribution of the photoelectric output signals ($P_k$) in the array arranging direction ($S_j$) during the interval between the repetition of the steps 2 and 3 and the setting of the mask holder 40 at the step 4.

Figure 13A:
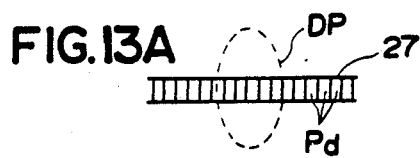
FIGS. 13A to 13D are diagrams for explaining the manner in which an enlarged spot image is varied in shape on the photodiode array during the focus detecting operation.
Figure 13B:
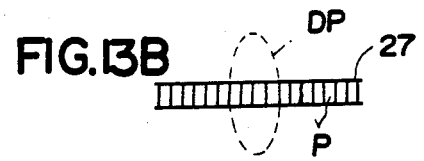
Figure 13C:
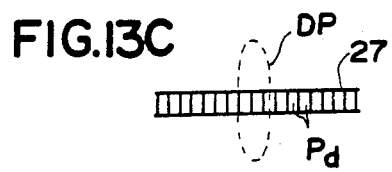
Figure 13D:
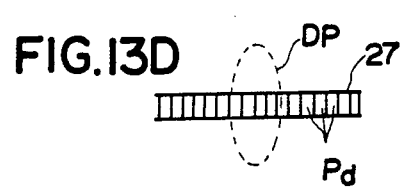
Figure 14A:
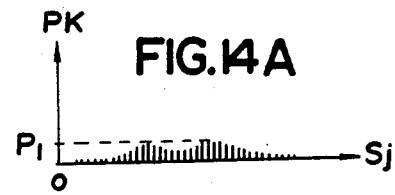
FIGS. 14A to 14D are waveform diagrams corresponding to FIGS. 13A to 13D showing variations in the distribution of the photoelectric output signals in the array arrangement direction.
Figure 14B:
Figure 14C:
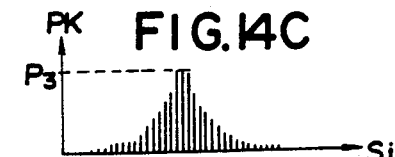
Figure 14D:

FIGS. 13A and 14A show the condition where the enlarged spot image DP is projected on the photosensitive surface of the photodiode array 27 through the adjustment of the plane parallel galss HG and the Z-position of the mask 20 is at $Z_1$. Thus, the mask 20 is not in an in-focus position as yet and the peak value $P_1$ of the resulting photoelectric output signals is at a low level. When the mask holder 40 is stepped so that the mask 20 reaches a position $Z_2$ which is nearer to the in-focus position, the conditions shown in FIGS. 13B and 14B result and the spot image DP becomes narrower. Thus, the resulting photoelectric output signals show a peak value $P_2$ of a higher level than $P_1$. Then, as the mask holder 40 is stepped further so that the in-focus position $Z_3$ is reached, the conditions shown in FIGS. 13C and 14C result and the enlarged spot image DP formed on the photodiode array 27 is made narrowest and sharpest. Thus, the peak value $P_3$ of the resulting photoelectric output signals has the maximum value. When the mask holder 40 reaches a position $Z_4$ which is beyond the in-focus position $Z_3$, the conditions shown in FIGS. 13D and 14D result in the enlarged spot image DP is again extended. Thus, the peak value $P_4$ of the resulting photoelectric output signals is also decreased in level.

Figure 15:
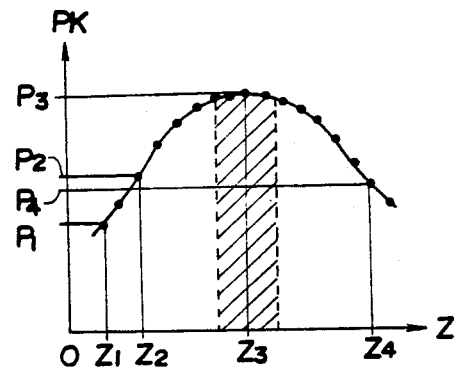
FIG. 15 is a waveform-diagram showing the plotting of the peak values of the photoelectric output signals from the photodiode array against the positions of the mask in the optical axis direction.
Figure 16:
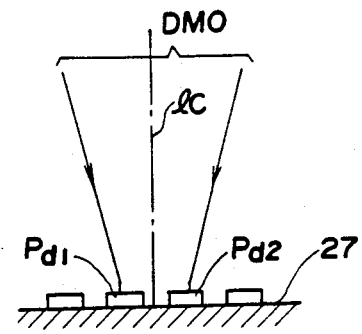
FIG. 16 is en enlarged diagram showing the positional relation between the detecting beam and the photodiode elements.

FIG. 15 shows the curve obtained by storing and plotting the peak value of the photoelectric output signals from the photodiode array 27 for each Z-direction position of the mask holder 40 in response to the stepping movements thereof in the above-mentioned manner. The beam BM is focussed on the mask 20 at the peak position $Z_3$ of FIG. 15. It is assumed here that in this condition the center $l_c$ (coincident with the optical axis of the beam $DM_o$) of the enlarged spot image DP is positioned just at the middle of the two adjoining photodiodes $Pd_1$ and $Pd_2$ of the array 27.

Figure 17A:
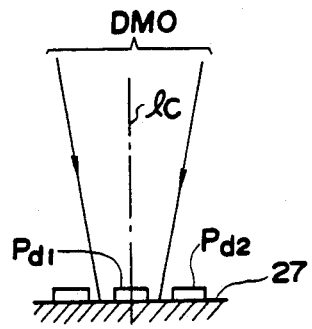
FIG. 17A is an enlarged diagram similar to FIG. 16, showing the manner in which the centering is achieved.
Figure 17B:
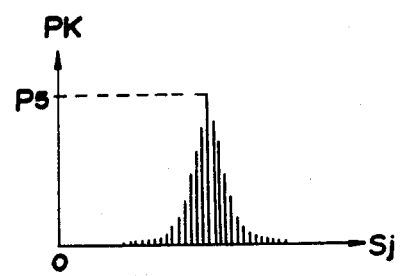
FIG. 17B is a wvaeform diagram corresponding to FIG. 17A, showing the distribution of the peak values of the photoelectric output signals from the photodiode array.

After the peak position $Z_3$ has been detected as mentioned above, a transfer is made to a step 5 where a drive command is applied to the motor 120 and the tilt of the plane parallel glass HG is adjusted. When the plane parallel glass HG is tilted so that the enlarged spot image DP is moved in either direction of the arrow J and shifted along the arranging direction of the photodiodes Pd as shown in FIGS. 8A or 8B, a transfer is made to a step 6 where whether the peak value output from the peak hold circuit 51 is greater than the peak value $P_3$ is determined while monitoring it by the computer 60. If the peak value output is greater than the peak value $P_3$, the tilt of the plane parallel glass HG is adjusted up to an angle at which the maximum value is obtained and then it is stopped. Then a transfer is made to a step 7 where the angle at which the maximum value was obtained is stored in the computer 60 by reading the output of the rotary encoder 119. In this case, the central axis $l_c$ of the enlarged spot image DP is positioned on the center $C_d$ of the photodiode Pd as shown in FIG. 17A and the peak value output has a peak value $P_5$ which is greater than $P_3$ as shown in FIG. 17B.

It is possible to arrange so that after the step 6 has been performed, the steps 2 and 3 are again performed to recheck whether the position $Z_3$ at which the peak value $P_5$ was obtained is really the accurate in-focus position.

The operation on the mask 20 has been described so far and it is only necessary to perform the operation on the wafer 21 in all the same way sequentially after each step for the mask or by simultaneous parallel processing in a time-shared manner.

After the high-accuracy in-focus position has thus been detected for the mask 20 and the beam BM and the wafer 21 and the beam BW, respectively, the position of the switch 107 is changed and also the system is placed in the alignment mode so as to obtain the desired mask and wafer alignment for the exposure step. It is to be noted that if this alignment is to be effected by using the diffracted beams as mentioned previously, the vibratory mirror 6 is vibrated.

Then, in the alignment mode, the mask 20 is first moved in the X and Y directions and the spot MS is brought into registration with the marks 20a in FIG. 5. While, in this case, it is possible to fix the spot MS and move the mask 20 by the mask holder 40, it is also possible, as the case may be, to tilt the plane parallel glass HG and bring the spot MS into registration with the marks 20a. In short, it is only necessary to arrange the marks 20a and 21a apart by the distance d between the spots MS and WS within the field 19b and there is no need to predetermine the absolute positions of the spots MS and WS within the field 19b.

In the case of this alignment mode, there the possibility that the tilting of the plane parallel glass HG causes the spots MS and WS to simultaneously shift in a direction perpendicular to their longitudinal directions while maintaining the distance d with the result that if the mask and the wafer are replaced, the centering of the spots MS and WS with respect to the photodiode arrays 27 and 28, respectively, is not necessarily achieved at all times. Then, after the mask and wafer alignment has been completed, the soft X-rays are projected from the mask side and the mask pattern is printed in the photosensitive layer on the wafer.

It is to be noted that in the case of an exposure system of a so-called step-and-repeat type in which the operation of moving a wafer a predetermined distance relative to a mask and exposing the wafer to light is repeated, it is particularly desirable that the gap between the mask and the wafer be always established accurately for each of the plurality of areas to be exposed on the wafer. Thus, to meet such a circumstance, the tilt angle (represented as $\theta_1$) of the plane parallel glass HG during the mask and wafer alignment is read from the encoder 119 and stored in the computer 60 and then in accordance with the steps shown in FIG. 18 the angles ($\theta_M$ represents the angle with respect to the mask and $\theta_W$ that with respect to the wafer) of the plane parallel glass HG stored previously at the step 7 are read out at a step 11 and the motor 120 is operated to adjust the angle of the plane parallel glass HG to $\theta_W$. In this case, there is no factor for displacing the mask relative to the objective lens 19 in the optical axis direction and thus the tilt angle of the plane parallel glass HG is simply adjusted to $\theta_W$. Then, the wafer stage 42 is moved in the Z direction at a step 12 and then the Z-direction position of the stage 42 corresponding to the maximum value of the focus signals (peak value signals) form the photodiode array 28 is detected at a step 13. At a step 14, the focussing of the beam BW on the wafer surface is effected. Then, the tilt angle of the plane parallel glass HG is restored to the angle $\theta_1$ stored in the computer 60 previously and the operating mode is changed to the alignment mode, thereby effecting the exposure of the next step.

Figure 18:
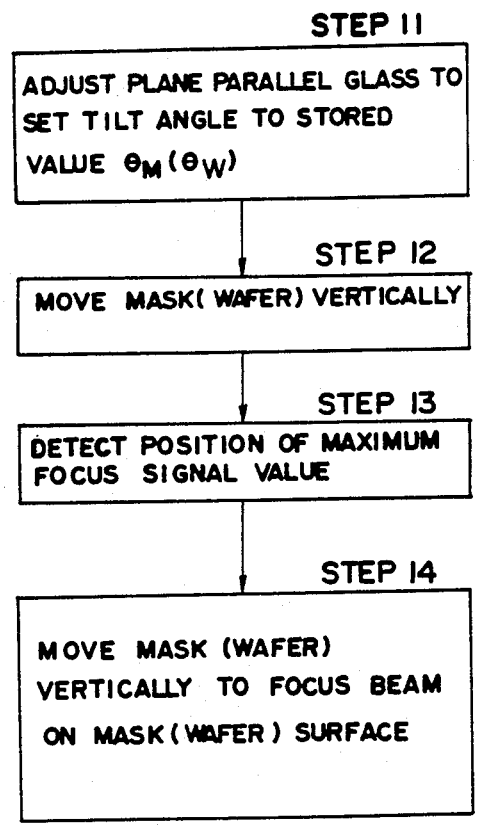
FIG. 18 is a flowchart showing the focusing operation performed for each of the successive exposure steps according to the step-and-repeat method.

While, in the above description made in connection with the flow of FIG. 18, the spot central axis $l_c$ is aligned with the center $C_d$ of the photodiode $Pd_1$, where the photodiodes of the array are accurately arranged at a predetermined pitch, all the same results can be obtained by varying the tilt angle of the plane parallel glass HG such that the central axis $l_c$ of the beam $DM_o$ (or $DW_o$) is shifted by an amount corresponding to an integral multiple of the pitch of arrangement of the photodiodes in the photodiode array 27 (or 28).

Also, when the actual focussing of the mask (or wafer) is effected, that is, when, with the central axis $l_c$ of the enlarged spot image DP in coincidence with the center $C_2$ of one of the photodiodes in the photodiode array, the mask (or wafer) is moved vertically so as to obtain the maximum value of the peak signals from the peak hold circuit 51, during the vertical movement of the mask (or wafer) the magnitudes of the peak signals corresponding to the vertical positions of the mask (or wafer) moved in unit increments may be stored in the computer 60 so as to perform an integrating operation and gravitational center position detection in accordance with the stored data.

In this case, the resulting data shows the similar characteristic to FIG. 15 in accordance with the Z-direction positions of the mask (or wafer). Thus, in order to improve the S/N ratio and accuracy further, it is possible to obtain the area of the region of the maximum value shown by the hatching in FIG. 15 (the integrating operation), obtain its gravitational center position by digital computation and return the mask (or wafer) to this position, thereby accurately focussing the enlarged spot image DP on the single photodiode.

While, in this embodiment, the optical means comprises the detecting optical system of the type which projects the two beam spots MS and WS so that it may be used with the proximity exposure system, in accordance with the present invention the provision of an optical system capable of projecting at least one spot of beam is sufficient. For instance, the invention can be applied in all the same way to any exposure system of the type in which the pattern image of a mask or reticle is printed on a wafer through a projection optical system. In this case, with the optical system of FIG. 2, the objective lens 19 corresponds to the projection optical system and the laser beam is, for example, directed to reach the wafer through the projection optical system without passing through the mask or reticle. Also, the detecting optical system is so designed that only the photoelectric detector 34 and the photodiode array 28 in FIG. 2 are used.

In this case, it is preferable to arrange it so that the center of the laser beam passes through the optical axis of the projection optical system. If this is not possible in view of the construction of the system, a plurality of beam spots may be projected on the peripheral portions within the projection exposure area of the wafer to detect the positions of the illuminated portions in the optical axis direction according to the reflected beams from the spot illuminated portions and the diffracted beams. Then, the detected position information are averaged to detect the deviation between the imaging plane of the projecting optical system and the wafer surface. Also, the inclination of the projection exposure area surface on the wafer can be detected from the optical axis-direction position information.

While, in the above-described embodiment, the marks 20a and 21 are comprised of marks arranged in diffraction grating patterns, the circuit patterns on the wafer or mask may be used in place of these marks so as to utilize the scattered light and diffracted light from the edges of these circuit patterns. Moreover, in addition to the projection of the laser beams vertically on the mask and wafer surfaces, the invention can also be carried out by obliquely projecting the beams on the surfaces.

What is claimed is:

1. An apparatus for detecting a positional deviation of a light reflective surface of an object from a reference plane, said apparatus comprising:
    means for projecting a beam of energy converging on said reference plane onto the light reflective surface of said object;
    means for converging said energy beam reflected from the light reflective surface, said converging energy beam forming a spot on a detecting plane at a different position from said reference plane, the size of said spot corresponding to a distance between said light reflective surface and said reference plane, a minimum size of said spot being attained when said light reflective surface is coincident with said reference plane;
    detecting means including a plurality of detecting elements on which said spot is formed, said detecting elements being arranged with a predetermined pitch in a first direction on said detecting plane, each of said detecting elements having a detective width not greater than the width of said spot converged into said minimum size in said first direction and producing an output signal corresponding to the intensity of said energy beam impinging thereon, said detecting means producing a detection output on the basis of said output signal in response to said spot attaining said minimum size and
    means for adjusting the relative positions of said spot and said detecting means whereby a center of said spot substantially coincides with a center of one of said plurality of detecting elements with respect to said first direction.

2. An apparatus according to claim 1 further comprising means for varying the distance between said object and said reference plane until said detection output is produced.

3. An apparatus according to claim 2 wherein said detecting means detects a peak value among the respective output signals of said detecting elements.

4. An apparatus according to claim 1, wherein the size of said spot and the size of said detecting elements are selected in such a manner that when the said spot of said minimum size is substantially coincident with a center of one of said detecting elements, the side edges of said spot do not impinge on either of the detecting elements adjacent to said one detecting element.

5. An apparatus according to claim 1 wherein said converging means forms an elongate spot elongated in a second direction transverse to said first direction, and wherein said adjusting means moves said elongate spot on said detecting plane in said first direction.

6. An apparatus according to claim 1, wherein said adjusting means includes optical means for moving said spot relative to said plurality of detecting elements.

7. An apparatus according to claim 6, wherein said energy beam projecting means includes a source of beam, and means forming a beam supply path between said source and said reference plane, and wherein said optical means is arranged in said beam supply path.

8. An apparatus for detecting a positional deviation of a light reflective surface of an object from a reference plane, said apparatus comprising:
  a beam supply source;
  means arranged between said beam supply source and said object for projecting a beam of energy converging on said reference plane onto the light reflective surface of said object;
  means for converging said energy beam reflected from the light reflective surface, said converging energy beam forming a spot on a detecting plane at a different position from said reference plane, the size of said spot corresponding to a distance between said light reflective surface and said reference plane, a minimum size of said spot being attained when said light reflective surface is coincident with said reference plane;
  detecting means including at least one detecting element on which said spot is formed, said detecting element being arranged on said detecting plane, said detecting element having a detective width not greater than the width of said spot converged into said minimum size in one direction on the detecting plane and producing an output signal corresponding to the intensity of said energy beam impinging thereon, said detecting means producing a detection output on the basis of said output signal in response to said spot attaining said minimum size; and
  means for adjusting the relative positions of said spot and said detecting means whereby a center of said spot substantially coincides with a center of said detecting element with respect to said one direction, said adjusting means being provided with an optical refracting member and means for moving said spot, said optical refracting member being mounted in a beam supply path extending from said beam supply source to said detecting plane through said reference plane and having an incidence plane and an exit plane which are substantially parallel to each other, said spot moving means being capable of inclining said member relative to the beam supply path so as to move said spot relative to said detecting element.

9. An apparatus according to claim 8, further comprising means for varying the distance between said object and said reference plane until said detection output is produced.

10. An apparatus according to claim 8, wherein said detecting means includes a plurality of detecting elements linearly arranged with a predetermined pitch along said one direction.

* * * * *